(12) United States Patent
Czubatyj et al.

(10) Patent No.: US 7,282,730 B2
(45) Date of Patent: Oct. 16, 2007

(54) FORMING A CARBON LAYER BETWEEN PHASE CHANGE LAYERS OF A PHASE CHANGE MEMORY

(75) Inventors: Wolodymyr Czubatyj, Warren, MI (US); Sergey Kostylev, Bloomfield Hills, MI (US); Tyler A. Lowrey, West Augusta, VA (US); Guy C. Wicker, Southfield, MI (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 11/037,850

(22) Filed: Jan. 18, 2005

(65) Prior Publication Data

US 2006/0157689 A1 Jul. 20, 2006

(51) Int. Cl.
*H01L 47/00* (2006.01)
(52) U.S. Cl. .................. 257/2; 257/E45.002; 257/3; 257/4; 257/42; 438/102
(58) Field of Classification Search .............. 257/2
See application file for complete search history.

(56) References Cited

U.S. PATENT DOCUMENTS 6,566,700 B2   5/2003  Xu .................. 257/296
6,869,841 B2   3/2005  Xu .................. 438/239
2006/0097341 A1*  5/2006  Pellizzer et al. ........ 257/528

OTHER PUBLICATIONS

Van Landingham, "Circuit Applications of Ovonic Switching Devices", IEEE Transactions on Electron Devices, vol. ED-20, No. 2, Feb. 1973.

* cited by examiner

*Primary Examiner*—Tu-Tu Ho
(74) *Attorney, Agent, or Firm*—Trop, Pruner & Hu, P.C.

(57) ABSTRACT

A carbon containing layer may be formed between a pair of chalcogenide containing layers of a phase change memory. When the lower chalcogenide layer allows current to pass, a filament may be formed therein. The filament then localizes the electrical heating of the carbon containing layer, converting a relatively localized region to a lower conductivity region. This region then causes the localization of heating and current flow through the upper phase change material layer. In some embodiments, less phase change material may be required to change phase to form a phase change memory, reducing the current requirements of the resulting phase change memory.

8 Claims, 2 Drawing Sheets

FORMING A CARBON LAYER BETWEEN PHASE CHANGE LAYERS OF A PHASE CHANGE MEMORY

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Conventionally, electrical energy is used to heat the phase change material and to cause the phase change material to transform between amorphous and crystalline phases. The phase change material may be fabricated within a pore filled with a chalcogenide material as one example. The volume of the pore defines the material that must change phase. The greater the volume of material that must change phase, the more electrical energy is required by the cell and the higher its power dissipation.

Thus, there is a need for better ways to convert phase change memories between phases.

DETAILED DESCRIPTION

Figure 1:
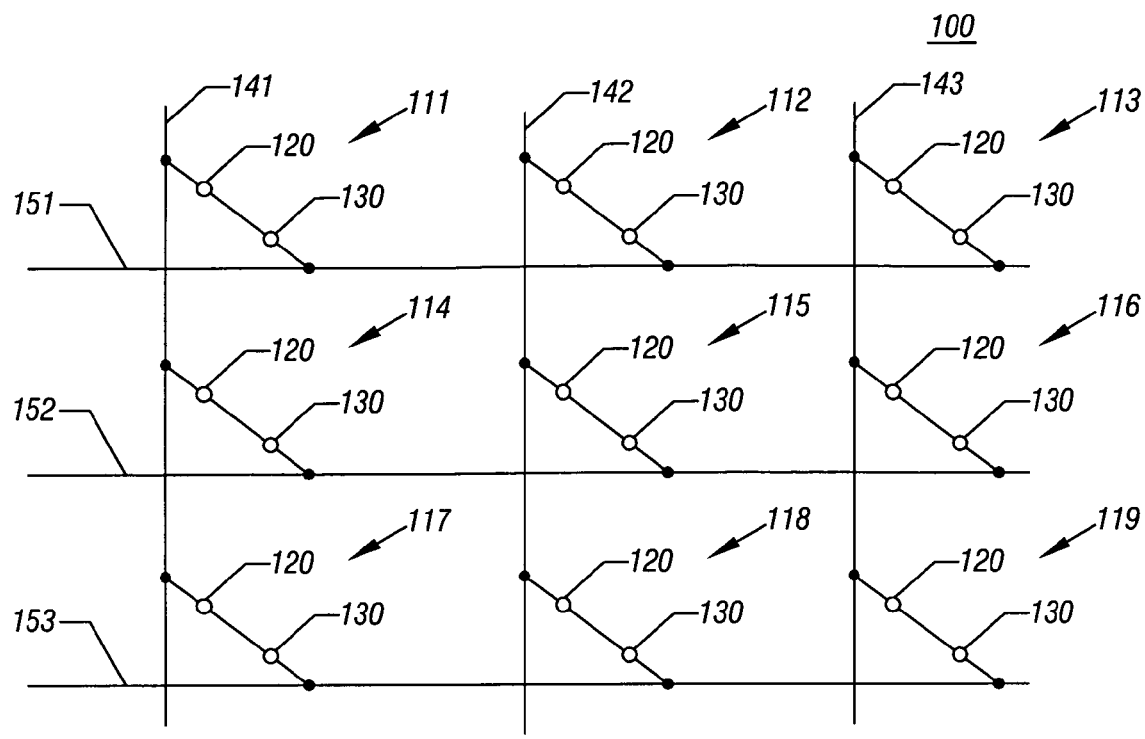
FIG. 1 is a schematic depiction of one embodiment of the present invention.

Turning to FIG. 1, an embodiment of a memory 100 is illustrated. Memory 100 may include a 3×3 array of memory cells 111-119, wherein memory cells 111-119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, oxygen, or selenium.

Memory 100 may include column lines 141-143 and row lines 151-153 to select a particular memory cell of the array during a write or read operation. Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 may be connected to row lines 151-153 and may be coupled to column lines 141-143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. A select device can be an ovonic threshold switch that can be made of a chalcogenide alloy that does not exhibit an amorphous to crystalline phase change and which undergoes rapid, electric field initiated change in electrical conductivity that persists only so long as a holding voltage (or current) is present. Select device 120 may operate as a switch that is either "off" or "on" depending on the amount of voltage potential applied across it, and, more particularly, whether the current through the select device exceeds its threshold current or voltage, which then triggers the device into the on state. The off state may be a substantially electrically nonconductive state and the on state may be a substantially conductive state, with less resistance than the off state. In the on state, the voltage across the select device is equal to its holding voltage $V_H$ plus IxRon, where Ron is the dynamic on resistance and I is the current through the select device. For example, select device 120 may have threshold voltages and, if a voltage potential less than the threshold voltage of a select device 120 is applied across select device 120, then at least one select device 120 may remain "off" or in a relatively high resistive state so that little or no electrical current passes through the memory cell and most of the voltage drop from selected row to selected column is across the select device. Alternatively, if a voltage potential greater than the threshold voltages of select device 120 is applied across select device 120, then the select device 120 may "turn on," i.e., operate in a relatively low resistive state so that electrical current passes through the memory cell. In other words, select device 120 may be in a substantially electrically nonconductive state if less than a predetermined voltage potential, e.g., the threshold voltage, is applied across select device 120. Select device 120 may be in a substantially conductive state if greater than the predetermined voltage potential is applied across select device 120. Select device 120 may also be referred to as an access device, an isolation device, or a switch.

In one embodiment, each select device 120 may comprise a switching material such as, for example, a chalcogenide alloy, and may be referred to as an ovonic threshold switch, or simply an ovonic threshold switch, or OTS. The switching material of select device 120 may be a material in a substantially amorphous state positioned between two electrodes that may be repeatedly and reversibly switched between a higher resistance "off" state (e.g., greater than about ten megaOhms) and a relatively lower resistance "on" state (e.g., about one hundred Ohms in series with $V_H$) by application of a predetermined electrical current or voltage potential. In this embodiment, each select device 120 may be a two terminal device that may have a current-voltage (I-V) characteristic similar to a phase change memory element that is in the amorphous state. However, unlike a phase change memory element, the switching material of select device 120 does not change phase. That is, the switching material of select device 120 may not be a programmable material, and, as a result, select device 120 may not be a memory device capable of storing information. For example, the switching material of select device 120 may remain permanently amorphous and the I-V characteristic may remain the same throughout the operating life.

In the low voltage or low electric field mode, i.e., where the voltage applied across select device 120 is less than a threshold voltage $V_{TH}$, select device 120 may be "off" or nonconducting, and exhibit a relatively high resistance, e.g., greater than about 10 megaohms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current $I_H$. Below this value, select device 120 may turn off and return to a relatively high resistance, nonconductive off state until the $V_{TH}$ and $I_{TH}$ are exceeded again.

Figure 2:
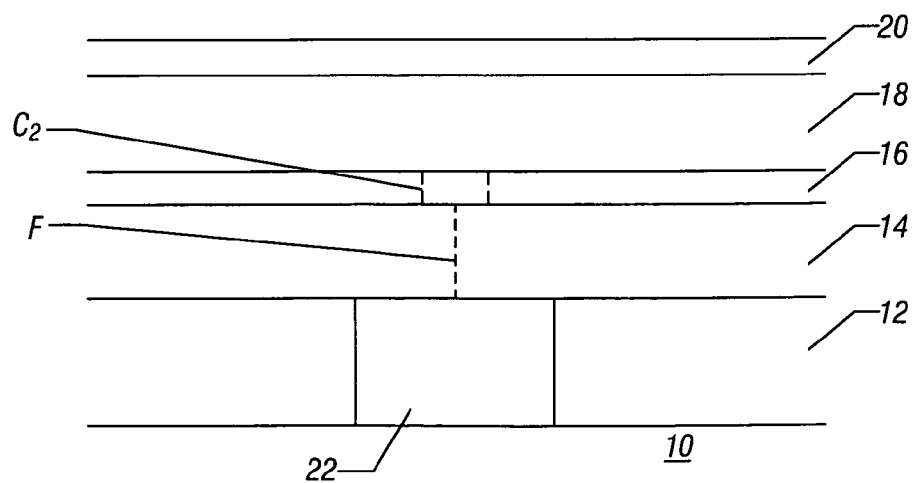
FIG. 2 is a greatly enlarged cross-sectional view of one embodiment of the present invention.

Referring to FIG. 2, a semiconductor substrate 10 may be covered by an insulating layer 12 having a contact 22 formed therein. Over the contact 22 and the, insulating layer 12 may be a relatively planar layer of non-phase change OTS material 14 in accordance with one embodiment of the present invention. The material 14 may implement a so-called ovonic threshold switch select device 120 of a phase change memory cell 111-119.

Over the layer 14 may be a layer 16 of carbon. The carbon layer 16 may also be planar and may be adhered to the layer 14. A planar second layer 18 of phase change material may overlie the carbon layer 16. The layer 18 may form the actual memory element 130 which changes phase and may correspond to a so-called ovonic universal memory or OUM. A layer 20 may be positioned over the layer 18 to act as an upper contact.

When appropriate biasing potentials or currents are applied, a filament F is formed by the electrical current passing between the contact 22 and layer 20. This filament F localizes the heating of the carbon layer 16. This causes the carbon layer 16 to change phase into a locally more conductive material. This region is indicated as $C_2$ in FIG. 2. This conductive carbon region $C_2$ then forms a lower contact to the overlying phase change material layer 18 of the OUM 130. The region $C_2$ may be relatively small and may be as small as the smallest filament F in the layer 14. Thus, the layer 14, which may form an OTS select device 120, itself becomes the isolation device in a memory array.

The carbon layer 16 may be formed of pure carbon which may be deposited by sputter deposition. However, other carbon containing materials may be utilized as well, including graphite and carbides, including silicon carbide and carbo-nitrides. In one embodiment, the layer 16 may be between about 50 and about 200 Angstroms thick.

In some embodiments of the present invention, the layers form their own locally programmed region. The exact location of the filament F cannot be determined in advance and is a function of the characteristics of any particular layer 14. However, wherever it forms, the filament F then in turn forms the region of higher conductivity $C_2$ in the carbon layer 16.

As a result, a relatively small contact may be made to the layer 18, reducing the amount of the phase change material 18 which must change phase in some embodiments. This may result in current and power dissipation reductions. Since the programmed region of the phase change material layer 18 is almost entirely surrounded by chalcogenide, and mostly thermally resistive material, this may lead to further reduction in programming current.

Programming of phase change material 18 to alter the state or phase of the material may be accomplished by applying voltage potentials to conductive materials 22 and 20, thereby generating a voltage potential across select device 120 and memory element 130. When the voltage potential is greater than the threshold voltage of select device 120 and memory element 130, then an electrical current may flow through memory material 18 in response to the applied voltage potential, and may result in heating of memory material 18.

This heating may alter the memory state or phase of memory material 18. Altering the phase or state of memory material 18 may alter the electrical characteristic of memory material 18, e.g., the resistance of the material may be altered by altering the phase of the memory material 18. Memory material 18 may also be referred to as a programmable resistive material.

In the "reset" state, memory material 18 may be in an amorphous or semi-amorphous state and in the "set" state, memory material 18 may be in an a crystalline or semi-crystalline state. The resistance of memory material 18 in the amorphous or semi-amorphous state may be greater than the resistance of memory material 18 in the crystalline or semi-crystalline state. It is to be appreciated that the association of reset and set with amorphous and crystalline states, respectively, is a convention and that at least an opposite convention may be adopted.

Using electrical current, memory material 18 may be heated to a relatively higher temperature to amorphosize memory material 18 and "reset" memory material 18 (e.g., program memory material 18 to a logic "0" value). Heating the volume of memory material 18 to a relatively lower crystallization temperature may crystallize memory material 18 and "set" memory material 18 (e.g., program memory material 18 to a logic "1" value). Various resistances of memory material 18 may be achieved to store information by varying the amount of current flow and duration through the volume of memory material 18.

Although the scope of the present invention is not limited in this respect, in one example, the composition of ovonic switching material 14 may comprise a Si concentration of about 14%, a Te concentration of about 39%, an As concentration of about 37%, a Ge concentration of about 9%, and an In concentration of about 1%. In another example, the composition of switching material 14 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 14 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 14 may include Si, Te, As, Ge, sulfur (S), and selenium (Se). As an example, the composition of switching material 14 may comprise a Si concentration of about 5%, a Te concentration of about 34%, an As concentration of about 28%, a Ge concentration of about 11%, a S concentration of about 21%, and a Se concentration of about 1%.

Conductive material 20 may be a thin film material having a thickness ranging from about 20 Å to about 2000 Å. In one embodiment, the thickness of the material 20 may range from about 100 Å to about 1000 Å. In another embodiment, the thickness of the material 20 may be about 300 Å. Suitable materials may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 14.

Figure 3:
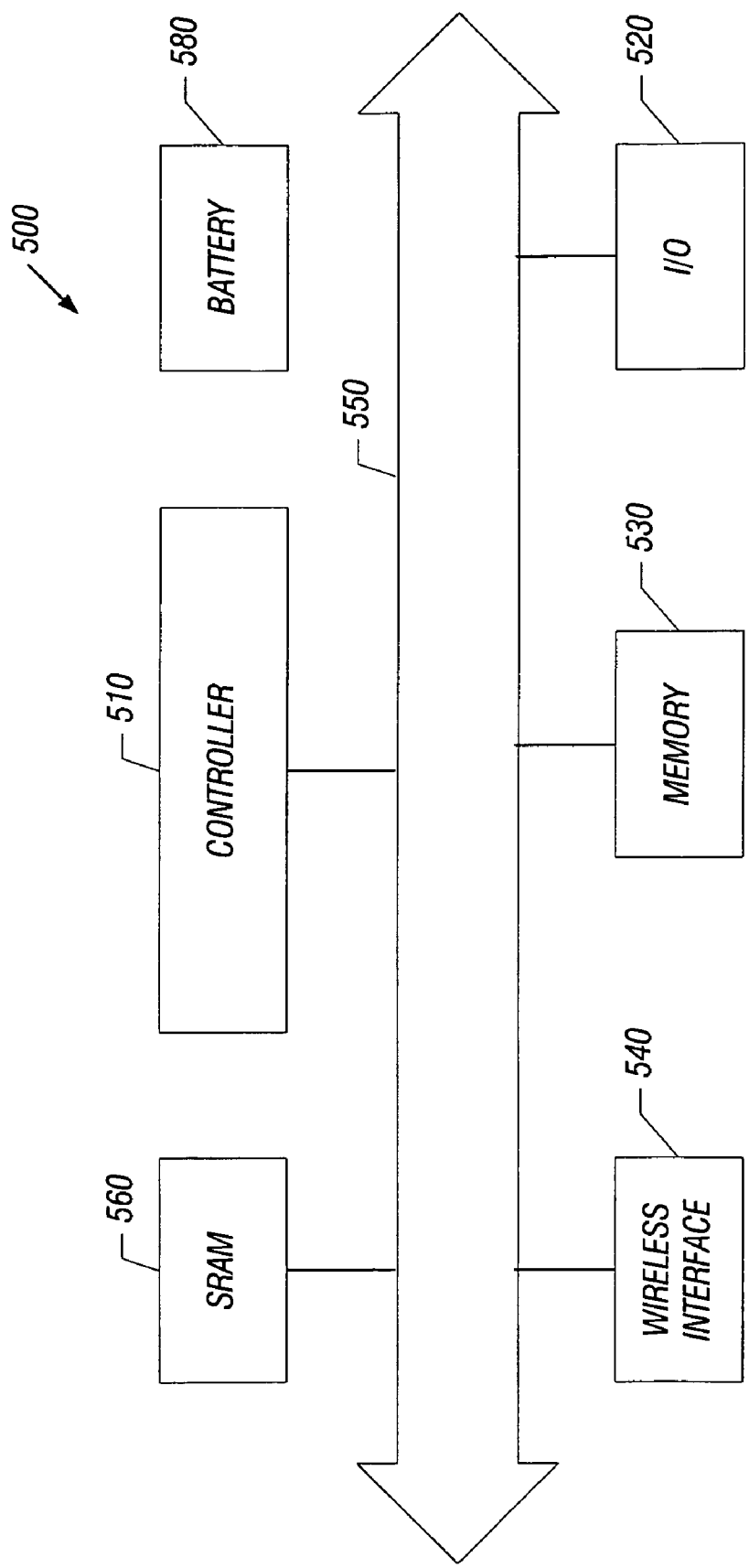
FIG. 3 is a system depiction of one embodiment of the present invention.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 860, and may be used to store user data. Memory 875 may be provided by one or more different types of memory. For example, memory 530 may comprise any type of random access memory, a volatile memory, a non-volatile memory such as a flash memory and/or a memory such as memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a carbon containing layer between and contacting a first and a second chalcogenide containing layer, said first chalcogenide containing layer being part of a select device and said second chalcogenide layer being part of a memory element.

2. The method of claim 1 including forming said carbon containing layer entirely of carbon.

3. The method of claim 2 including forming said carbon containing layer by sputtering.

4. The method of claim 1 including forming said first chalcogenide containing layer of different material than said second chalcogenide containing layer.

5. The method of claim 1 wherein only said second chalcogenide containing layer changes phase between amorphous and crystalline phases.

6. A method comprising:
    causing a carbon containing layer between and contacting a first chalcogenide containing layer and a second chalcogenide containing layer to change phase, said first chalcogenide containing layer being part of a select device and said second chalcogenide containing layer being part of a memory element.

7. The method of claim 6 including passing current through said carbon containing layer to change its phase.

8. The method of claim 6 including forming a filament in one of said pair of chalcogenide containing layers, and using said filament to change the phase of said carbon containing layer.

* * * * *